United States Patent [19]

Pausch et al.

[11] Patent Number: 5,574,373
[45] Date of Patent: Nov. 12, 1996

[54] LOCAL GRADIENT COIL ARRANGEMENT FOR NUCLEAR MAGNETIC RESONANCE TOMOGRAPHY APPARATUS

[75] Inventors: Guenther Pausch, Effeltrich; Eva Eberlein, Baiersdorf, both of Germany

[73] Assignee: Siemens Aktiengesellschaft, Munich, Germany

[21] Appl. No.: 590,818

[22] Filed: Jan. 24, 1996

[30] Foreign Application Priority Data

Feb. 7, 1995 [DE] Germany ................. 195 04 171.2

[51] Int. Cl.⁶ ........................................... G01V 3/00
[52] U.S. Cl. ............................. 324/318; 128/653.5
[58] Field of Search ........................ 324/318, 322, 324/309, 307, 319, 320; 128/653.2, 653.5

[56] References Cited

U.S. PATENT DOCUMENTS

| | | | |
|---|---|---|---|
| 4,456,881 | 6/1984 | Compton | 324/319 |
| 4,910,462 | 3/1990 | Roemer et al. | 324/318 |
| 5,235,279 | 8/1993 | Kaufman et al. | 324/309 |
| 5,309,107 | 5/1994 | Pausch | 324/318 |
| 5,372,137 | 12/1994 | Wong et al. | 324/318 |
| 5,378,989 | 1/1995 | Barber et al. | 324/318 |
| 5,465,719 | 11/1995 | Itagaki et al. | 324/318 |
| 5,497,089 | 3/1996 | Lampman et al. | 324/318 |

FOREIGN PATENT DOCUMENTS

| | | |
|---|---|---|
| 0313213 | 4/1989 | European Pat. Off. . |
| 3932648 | 4/1991 | Germany . |

OTHER PUBLICATIONS

"NMR Imaging Techniques and Applications: A Review," Bottomley, Rev. Sci. Instrum. 53(9) Sep. 1982, pp. 1319–1337.

Primary Examiner—Louis M. Arana
Attorney, Agent, or Firm—Hill, Steadman & Simpson

[57] ABSTRACT

A local gradient coil arrangement having an essentially hollow-cylindrical geometry can be separated at at least one side along a separating line proceeding in the axial direction of the arrangement. All gradient coil conductors that would cross the separating line are interrupted at the separating line. The currents at each side of the separating line are carried via connecting lines that proceed parallel to the separating line. The gradient coil arrangement can thus be divided into two parts without having to provide contacts between these two parts.

10 Claims, 14 Drawing Sheets

LOCAL GRADIENT COIL ARRANGEMENT FOR NUCLEAR MAGNETIC RESONANCE TOMOGRAPHY APPARATUS

BACKGROUND OF THE INVENTION

1. Field of the Invention

The present invention is directed to a local gradient coil arrangement for a nuclear magnetic resonance tomography apparatus having an essentially hollow-cylindrical geometry and composed of a number of gradient coils for different spatial directions, the gradient coil arrangement being separable at least at one side along a separating parting line proceeding in the axial direction of the arrangement.

2. Description of the Prior Art

As known, the spatial resolution of the nuclear magnetic resonance signals in nuclear magnetic resonance tomography ensues by superimposing a magnetic field gradient on a uniform, static, basic field on the order of magnitude of 1 T. The principles of such imaging are set forth, for example, in the article by Bottomley, "NMR Imaging Techniques and Applications: A Review", in *Review of Scientific Instrumentation* 53, 9, 9/82, pages 1319–1337.

U.S. Pat. No. 4,910,462 discloses a gradient coil for generating a longitudinal magnetic field. This coil is etched from a planar structure and is then rolled into a cylindrical shape. In order to avoid having to connect a number of conductors to one another after rolling the etched structure into a cylindrical shape, the conductors are arcuately returned at the ends of the flat structure. When being rolled to form a cylinder, these returns overlap such that respective conductors having opposite current directions lie on top of one another so that a disturbing, resultant magnetic field is not produced.

German OS 39 32 648 discloses a high-frequency local coil for nuclear magnetic resonance tomography that is divisible for easier introduction of body parts.

European Application 0 313 213 discloses a gradient coil arrangement wherein the gradient field strength in the examination subject is increased by means of attaching at least one set of gradient coils so as to be closer to the body of the examination subject than the other coils. A departure is thus made from the otherwise rotationally symmetrical form.

The gradient coils are usually arranged on a carrying tube which is rigidly installed in a basic field magnet and which encloses the entire patient opening. Given a radius r of the gradient coil at a given field strength and field quality, the energy of the gradient coil, and thus its inductivity, is proportional to $r^n$, whereby n>5. For this reason, it is especially advantageous to keep the diameter of gradient coils as small as possible, i.e., to place them as close as possible to the subject to be examined. Given rigidly installed gradient coils, however, physical limits as to the minimum diameter are imposed by the required patient space.

For this reason, so-called local gradient coils were proposed that do not surround the entire patient space but, in the form of special coils, surround only the actual anatomy to be examined, i.e., for example, the head or extremities. Similar to local radio-frequency coils, interchangeable special gradient coils are thus provided for different examination regions. The advantage of lower inductivity associated with the smaller volume of such local gradient coils is especially significant when fast rise and decay times of the gradient current or high gradient field strengths are desired. This is the case given fast pulse sequences such as, for example, echo planar imaging (EPI).

When all of the required gradient coils for the three spatial directions are applied on a hollow cylinder, this must be passed over the patient, or the patient must be inserted into the hollow cylinder. This is rather impractical in terms of manipulation, especially since the hollow cylinder should be implemented as snugly as possible.

If, however, the gradient coil is made divisible (separable) for easier manipulation, then the problem arises that the individual turns of the gradient coil must be connected to one another via a plurality of contact points. This is explained in greater detail below with reference to FIGS. 1 through 3. FIGS. 1 through 3 respectively show the same hollow cylinder 5 on which three gradient coils 2 through 4 for the three spatial directions are applied. For greater clarity, the three gradient coils 2 through 4 are respectively separately shown in FIGS. 1 through 3.

FIG. 1 shows a saddle-shaped gradient coil of a conventional type having individual coils 2a through 2d for generating a gradient in the y-direction according to the Cartesian coordinate system entered in FIG. 1. The inner conductors thereby supply the useful field, the conductors proceeding parallel to the z-directions make no contribution to the y-gradient due to their direction, and the conductors lying at the outside can be left out of consideration due to their greater distance from the examination region in the center of the hollow cylinder 5. A separating line 5a is shown in FIG. 1 for the hollow cylinder 5. The hollow cylinder 5 with the gradient coils 2 can be unproblematically separated along this line 5a since no conductor crosses the separating line.

FIG. 2 shows a gradient coil 3 for the z-direction. This is composed of two coil parts 3a and 3b with opposite current directions. Given a separation of the hollow cylinder 5, all turns would have to be interrupted here.

FIG. 3 shows a gradient coil 4 for the x-direction. Like the gradient coil for the y-direction, this is composed of four individual saddle coils; only the saddle coils 4a and 4b are visible in FIG. 3. The gradient coil for the x-direction is offset by 90° in azimuthal direction compared to the gradient coil 2 for the y-direction. All turns thus also cross the separating line 5a given these coils and thus must be divided.

A number of contacts are therefore required at the separating line 5a when one wishes to generate the magnetic field gradients for all spatial directions with local gradient coil. These contacts must have a considerable current-carrying capability since gradient currents on the order of magnetic of, typically, 200 through 250 A are required. Further, high voltages also occur at the gradient coils. Finally, the contacts would have to be easy to open. Such solutions would be extremely involved in technical terms insofar as they are even possible.

SUMMARY OF THE INVENTION

It is therefore an object of the present invention to provide a divisible local gradient coil arrangement such that the aforementioned disadvantages are avoided even in the case of a complete set of gradient coils.

This object is inventively achieved in a gradient coil arrangement wherein all gradient coils are separable (divisible) and wherein all gradient coil conductors that cross the separating line are interrupted at the separating line, and wherein the currents at each side of the separating line are carried via connecting lines that proceed parallel to the separating line. No contact locations whatsoever are thus present at the separating line.

DESCRIPTION OF THE PREFERRED EMBODIMENTS

Figure 1:
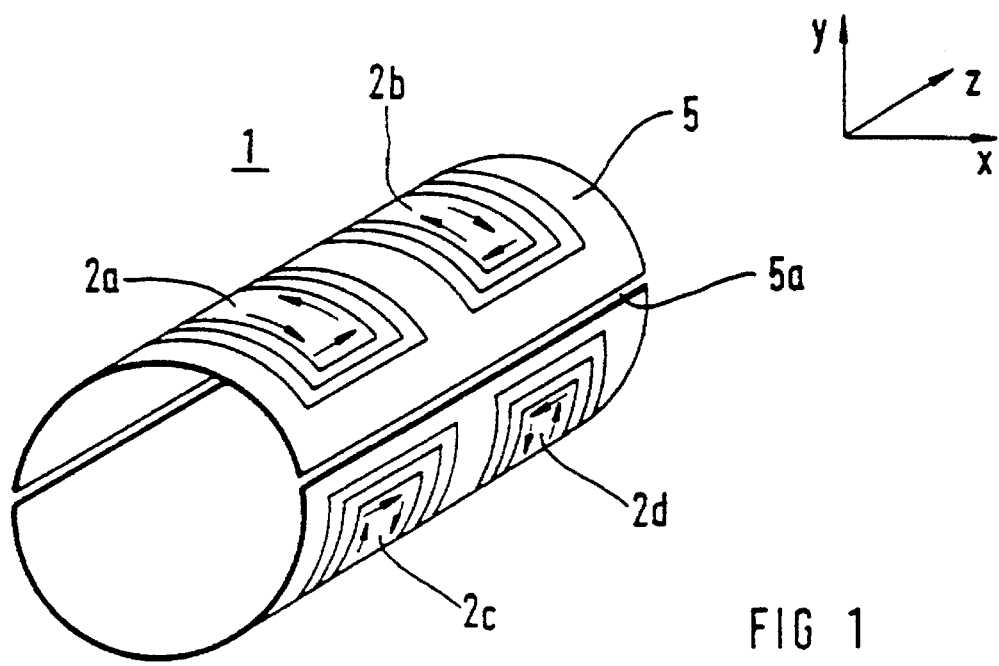
FIGS. 1, 2 and 3, as described above, illustrate a known structure for a divisible separable gradient coil arrangement in a nuclear magnetic resonance tomography apparatus.
Figure 2:
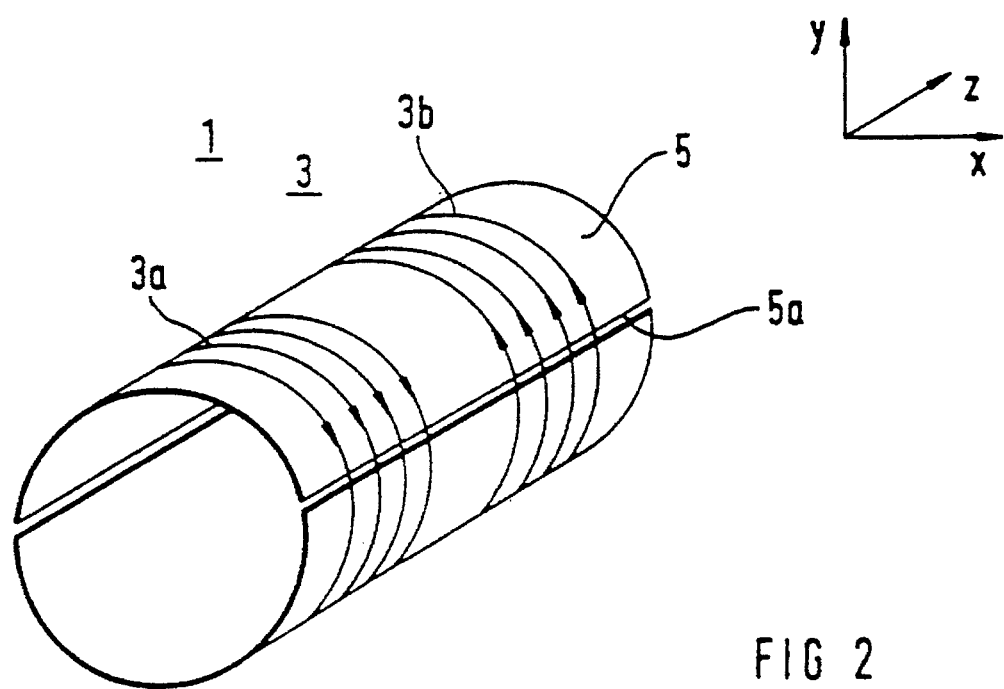
Figure 3:
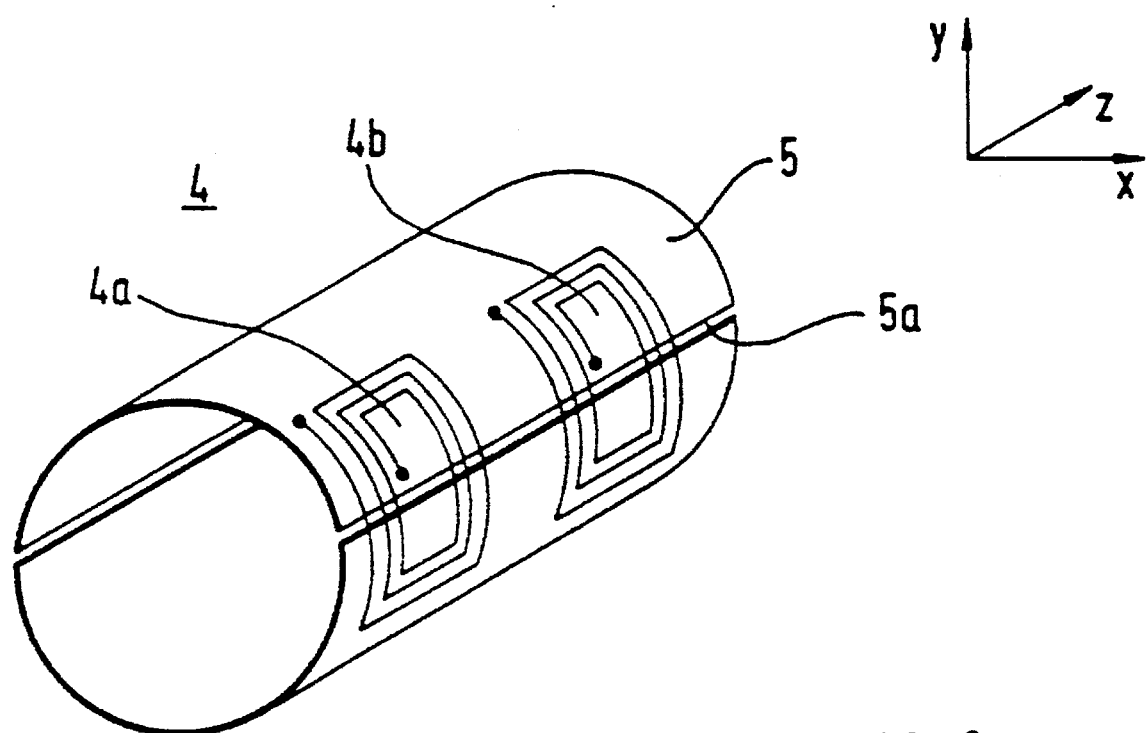
Figure 4:
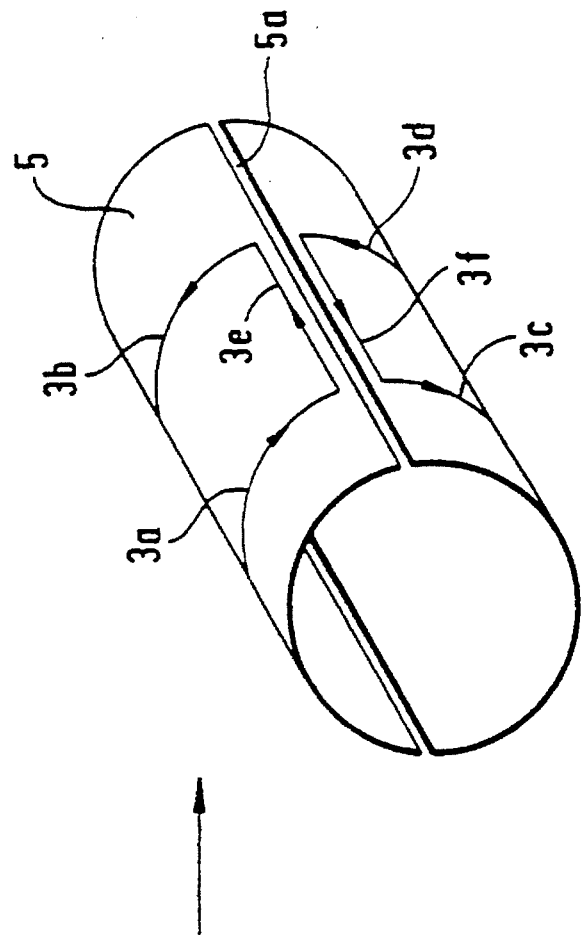
FIG. 4 illustrates a separable z-gradient coil constructed in accordance with the principles of the present invention.
Figure 4:
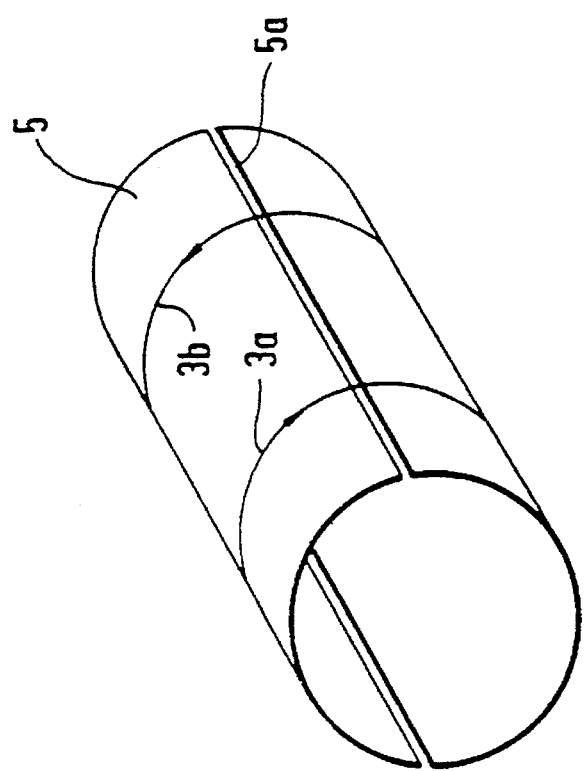

FIG. 4 shows the inventive principle of the separation of the gradient coil for the z-direction, whereby only two turns are entered for clarity. Whereas the conventional arrangement has conductors 3a and 3b that cross the separating line 5a is shown at the left of FIG. 4, the right side of FIG. 4 shows the inventive principle wherein a separation of the individual turns into turns portions 3a, 3c, 3b and 3d ensues at the separating line 5a. The separated conductor parts 3a and 3b connected by a connecting line 3e and the conductor parts 3c and 3d are connected by a connecting line 3f, the connecting lines 3e and 3f extending parallel to the separating line 5a. The corresponding connection, of course, also applies to the back side of the hollow cylinder 5, which cannot be seen.

The same currents as in conventional windings can thus flow in the winding sections 3a through 3d, however, they no longer flow across the separating line 5a but,—for example, for the winding section 3a—flow via the connecting line 3e to the winding section 3b, or from the winding section 3d via the connecting line 3f to the winding section 3c.

Figure 5:
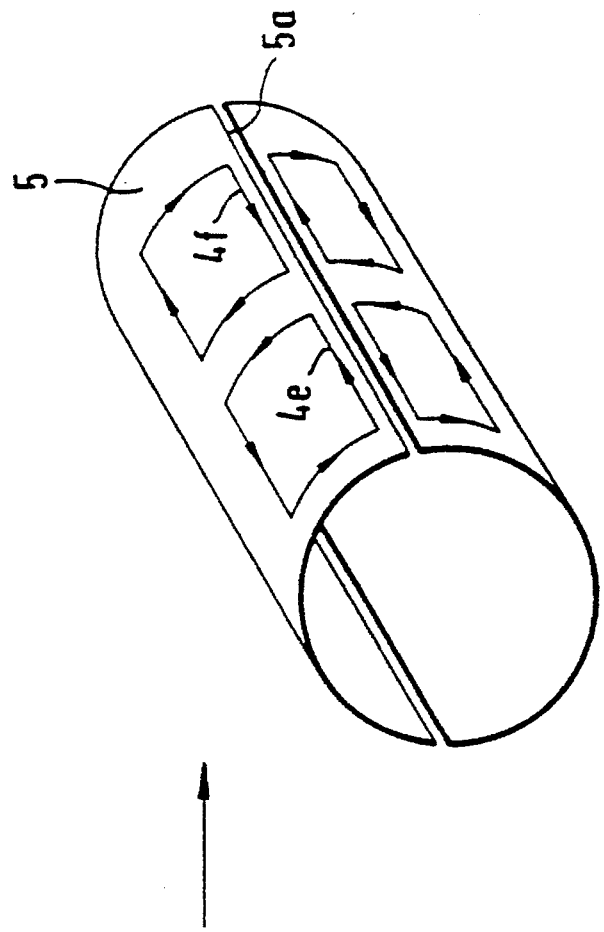
FIG. 5 illustrates a separable x-gradient coil constructed in accordance with the principles of the present invention.
Figure 5:
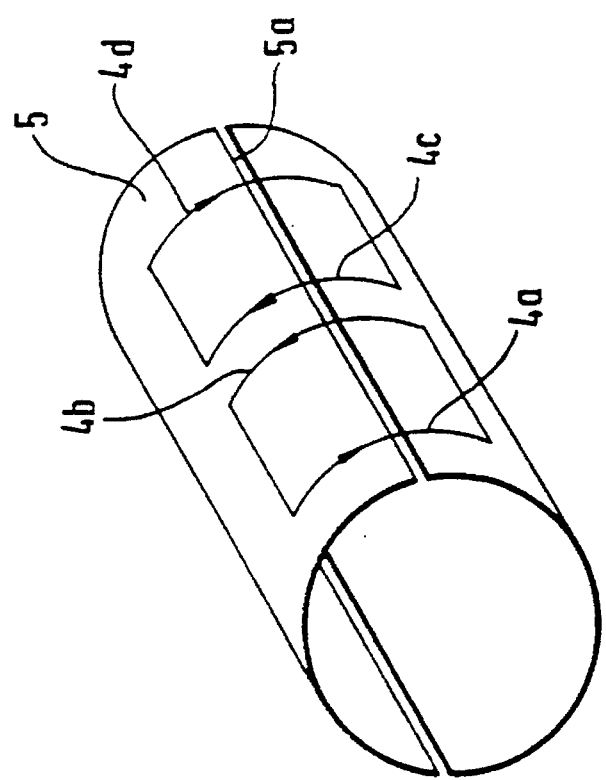

The corresponding case is true of the gradient coil for the x-direction according to FIG. 5. Again, the winding sections 4a through 4d are separated at the separating line 5a and the current is conducted via connecting lines 4e and 4f extending parallel to the separating line 5c.

In practice, of course, the individual gradient coils have more turns, which are not shown in FIGS. 4 and 5 for clarity. The principle, however, remains the same, i.e. each turn (winding) is separated at the separating line 5a and is connected along the separating line 5a to a turn part that lies opposite in the z-direction symmetrically relative to the cross-sectional plane of the cylinder 5.

The effect of the connecting lines conducted along the separating line 5a, i.e. in the z-direction, on the basic magnetic field can be neglected since they generate no field components in the z-direction, and thus do not contribute to the useful field of the z-gradient dGz/dz or dGz/dx. Moreover, because each connecting line has a counterpart in which current flows in an opposite direction and both conductors extend parallely past one another at a short spacing, the connecting lines increase the inductivity of the overall arrangement only to an insignificant extent. A disadvantage is that the dissipative losses of such a coil increase corresponding to the resistances of the connecting lines. This disadvantage, however, is insignificant compared to the advantage of simple separability.

Figure 6:
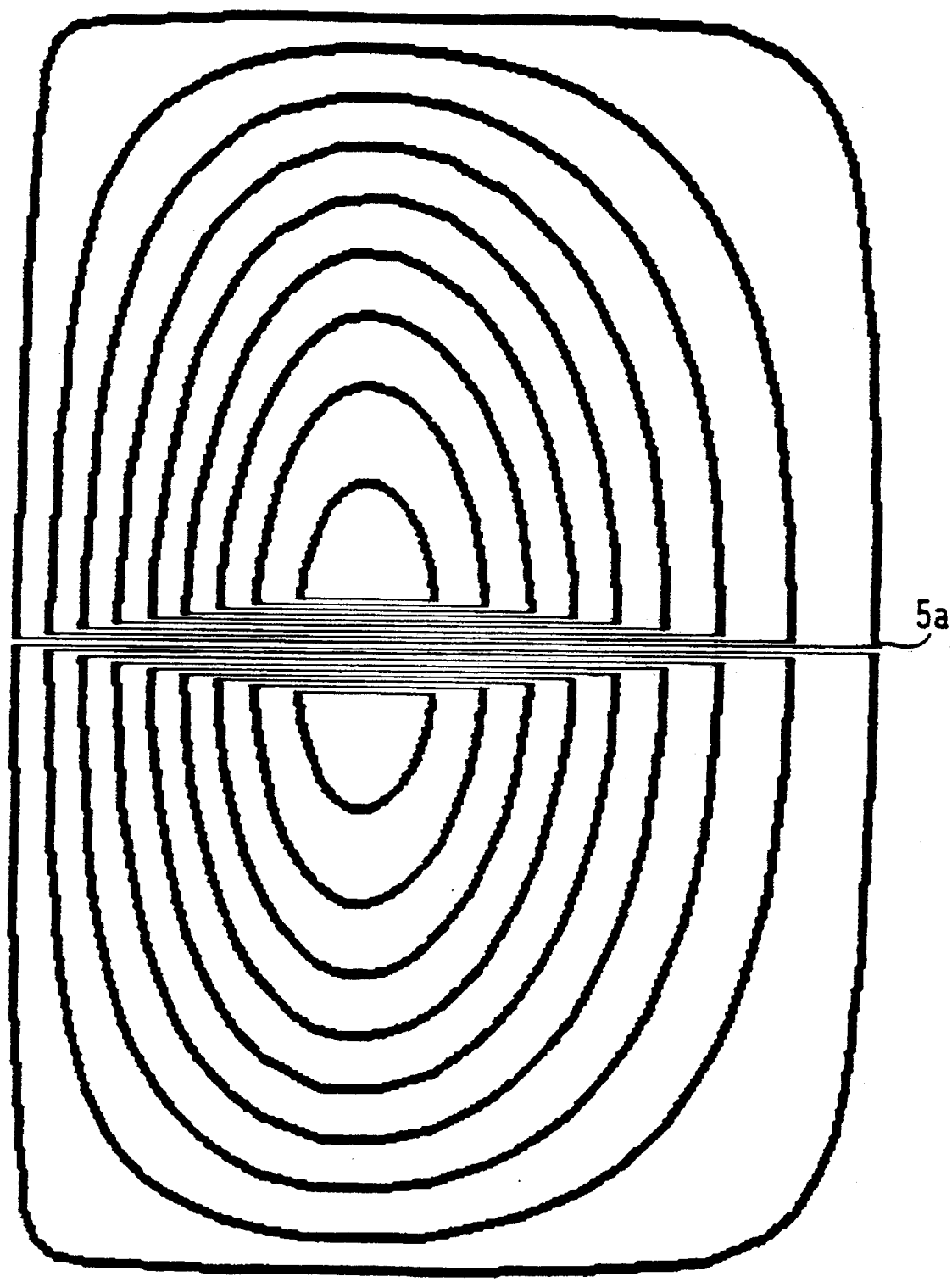
FIG. 6 shows an individual gradient coil winding according to a so-called fingerprint design.

The application of the inventive principle is not limited to simple coil geometries with straight-line conductor arcs; rather, the transverse gradient coils can also be fashioned as what are referred to as so-called fingerprint coils of the type disclosed, for example, in U.S. Pat. No. 4,456,881. As an example, FIG. 6 shows an individual sub-coil of the x-gradient coil with the separating line 5a and the corresponding connecting lines along the separating line 5a.

Figure 7:
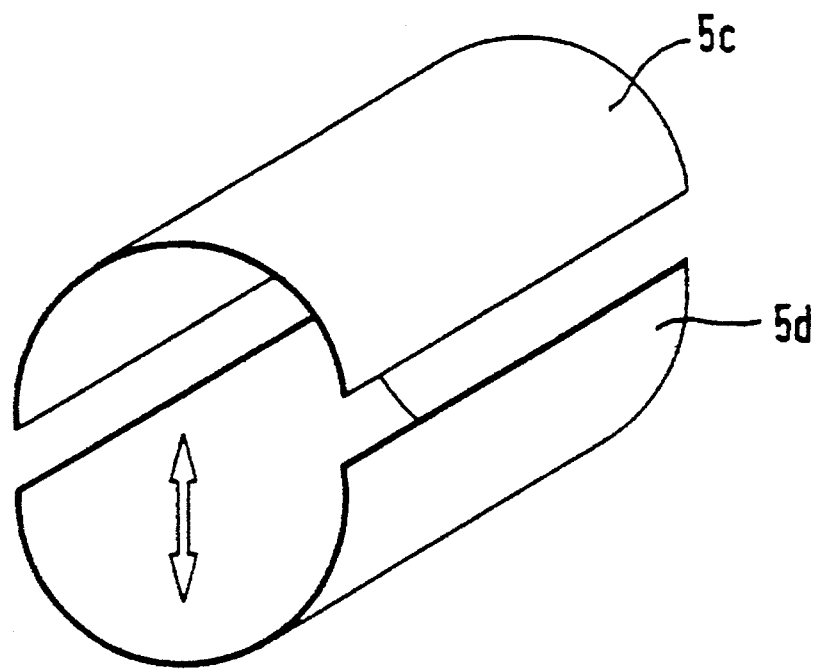
FIG. 7 shows a gradient coil arrangement constructed in accordance with the principles of the present invention having an upwardly removable upper part.
Figure 8:
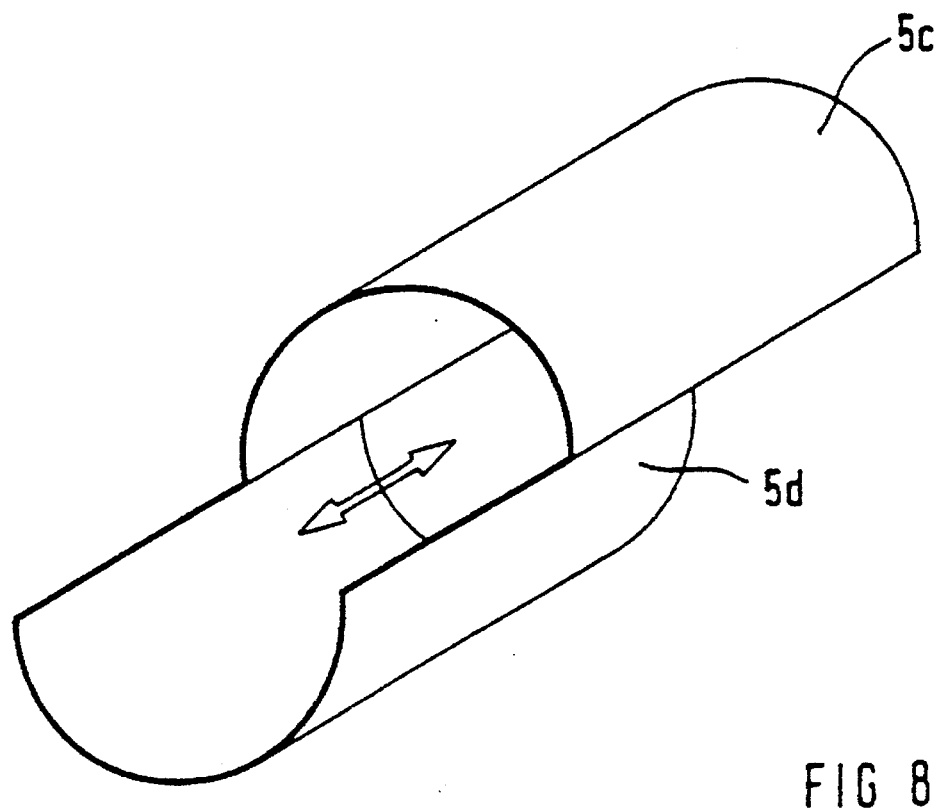
FIG. 8 shows a gradient coil arrangement constructed in accordance with the principles of the present invention having an upper part removable in the axial direction.
Figure 9:
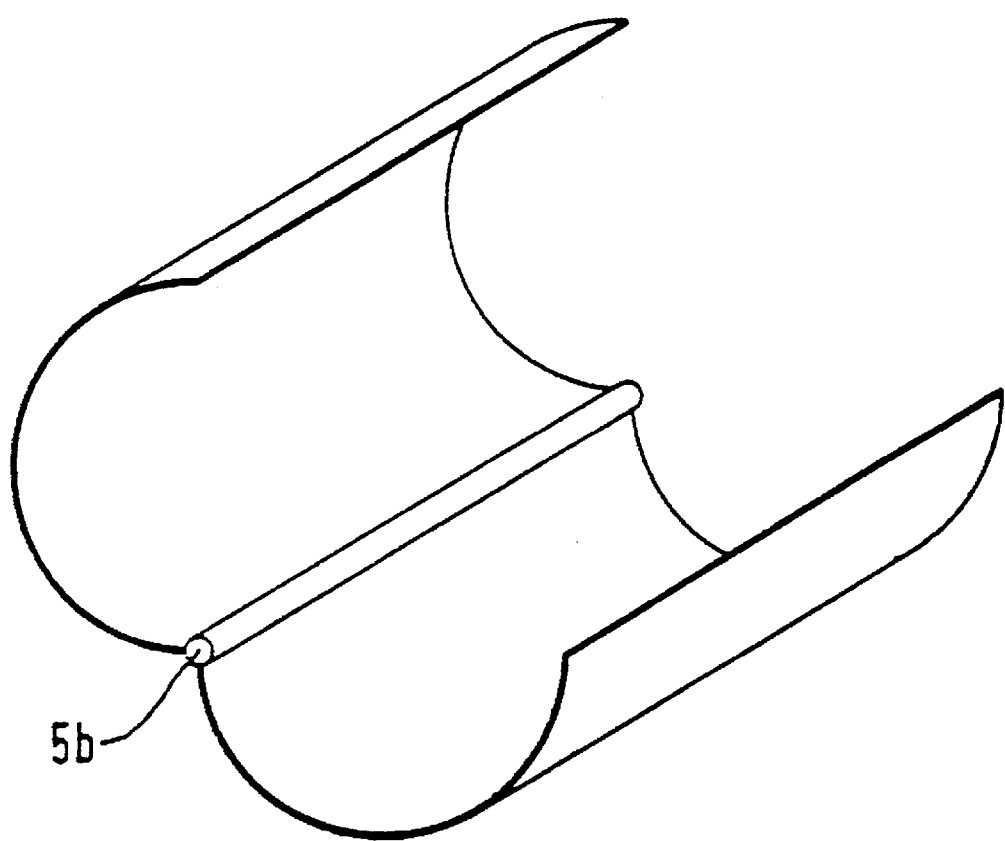
FIG. 9 shows a gradient coil arrangement constructed in accordance with the principles of the present invention having an upper part that can be swung upwardly.

The simple divisibility of the gradient coil arrangement can be used in various ways. In the exemplary embodiment of FIG. 7, the upper part 5c of the arrangement can be lifted off from the lower part 5d. In the exemplary embodiment of FIG. 8, the upper part 5c can be pulled away from the upper part 5c in the direction of the cylinder axis. In the exemplary embodiment of FIG. 9, the gradient coil arrangement can be swung upwardly around a hinge on an axis 5b.

Figure 10:
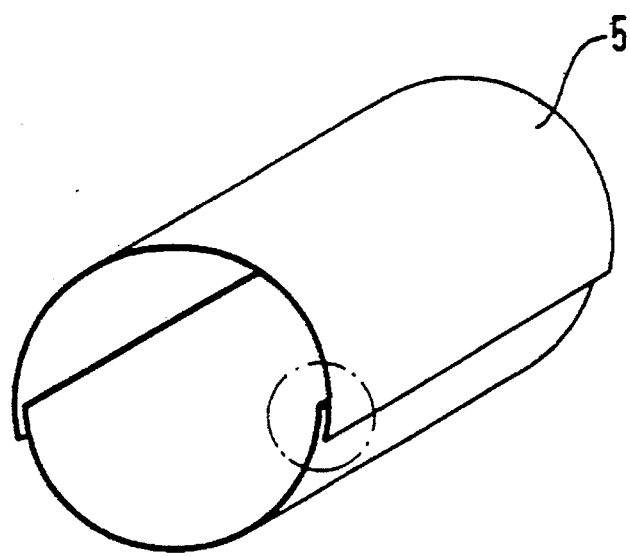
FIG. 10 shows a gradient coil arrangement constructed in accordance with the principles of the present invention with an overlap at the separating locations.
Figure 11:
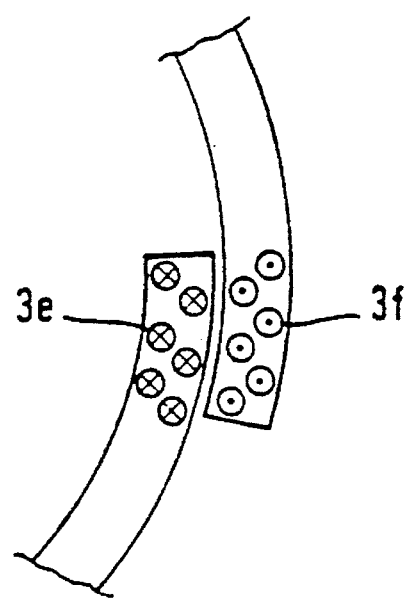
FIG. 11 shows a detail of the overlap in FIG. 10.

In order to resolve the competing requirements of making adequate room for the connecting lines and conducting the current-traversed connecting lines past one another as closely as possible to one another in view of a low inductivity, an overlap of the respective coil parts which accept the connecting lines can be provided. As shown in FIGS. 10 and 11, such an overlap can ensue in the azimuthal direction. FIG. 11 thereby shows the arrangement of connecting lines 3e, 3f in detail in the overlap region.

Figure 12:
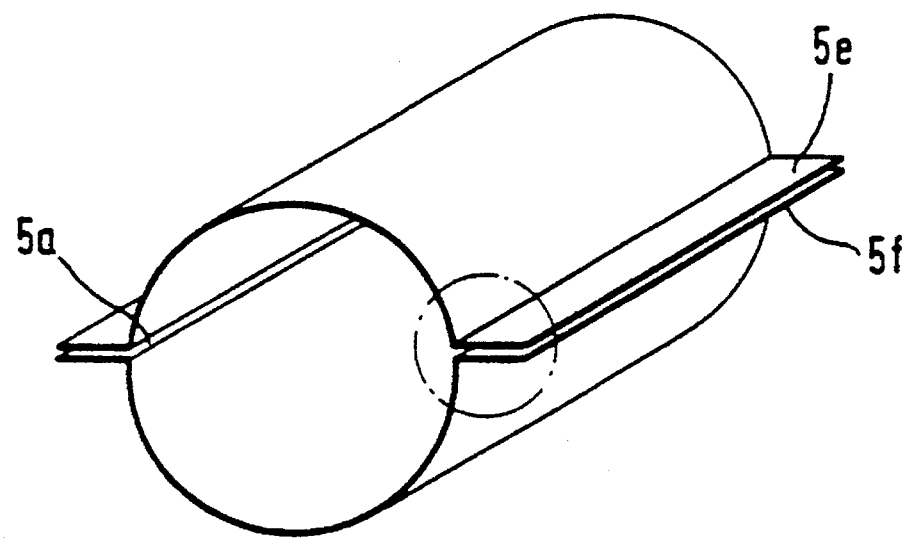
FIG. 12 shows a gradient coil arrangement constructed in accordance with the principles of the present invention having radially expanded parallel surfaces.
Figure 13:
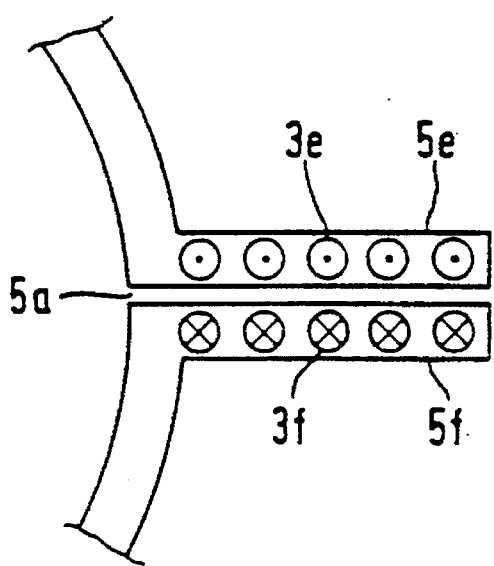
FIG. 13 shows a detail of the surfaces in FIG. 2 expanded in the radial direction.
Figure 14:
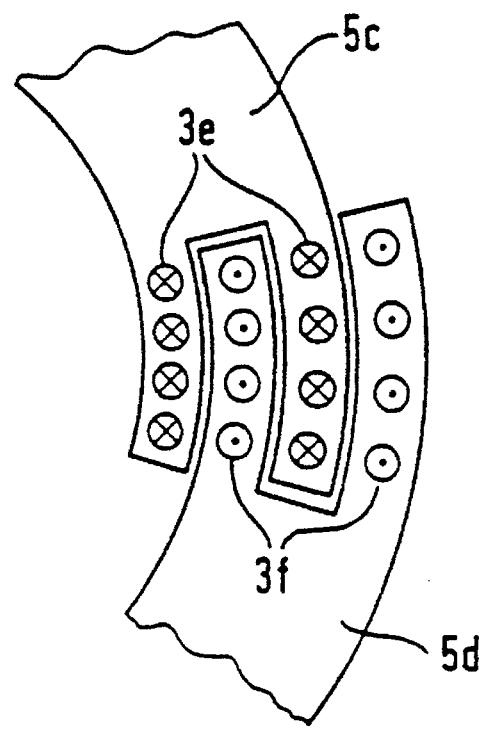
FIG. 14 shows a comb-like azimuthal overlap.

As shown in FIG. 12, an overlap can also ensue, for example, in radially extending or projecting surfaces 5e, 5f at each side of the parting line 5a. FIG. 13 shows the accommodation of the connecting lines 3e, 3f in the projecting surfaces 5e, 5f in detail. An even denser allocation of the connecting lines with oppositely flowing currents is achieved with a comb-like overlap. This is shown in FIG. 14 for the case of an azimuthal overlap. The two parts 5c, 5d of the hollow cylinder thereby each have a channel at the separating line, whereby connecting lines 3e and 3f respectively being received between the sidewalls of these channels. When the gradient coil is assembled, the two parts engage into one another, so that the connecting lines 3e, 3f are in close proximity.

This arrangement also has the advantage that a good guidance of the two hollow cylinder parts simultaneously is achieved due to the channels. For example, the channels can be shaped such that one part of the gradient coil arrangement can be pulled away from the other in axial direction according to the exemplary embodiment of FIG. 8.

Figure 15:
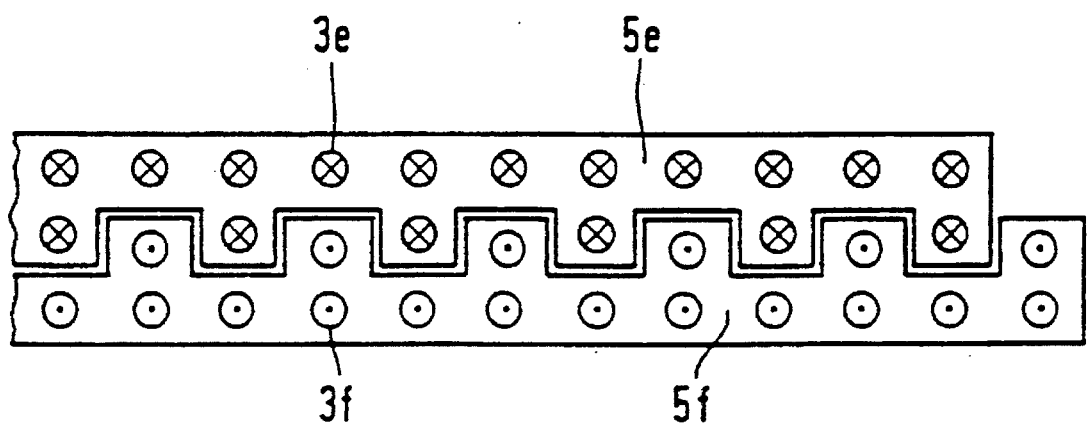
FIG. 15 shows a comb-like overlap of the radially expanded surfaces.

As shown in FIG. 15, a comb-like overlap is also possible given the embodiment with radially expanded surfaces. The two surfaces 5e and 5f thereby have a number of channels that are fashioned such that the two surfaces 5e and 5f engage comb-like into one another. Connecting lines 3e, 3f are accommodated in the webs between the channels, so that the connecting lines 3e, 3f lying opposite one another are likewise in close proximity. Here, too, one obtains the advantage of a good guidance of the two hollow cylinder parts relative to one another is obtained.

Figure 16:
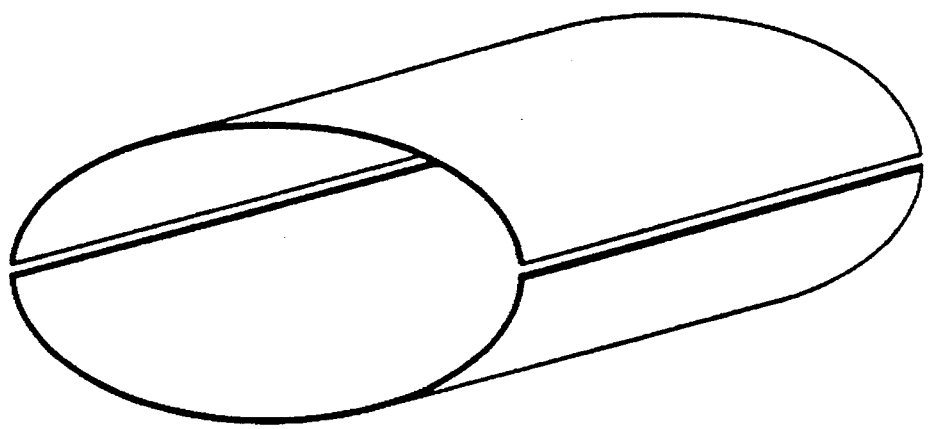
FIG. 16 shows a gradient coil arrangement constructed in accordance with the principles of the present invention having an elliptical cross section.
Figure 17:
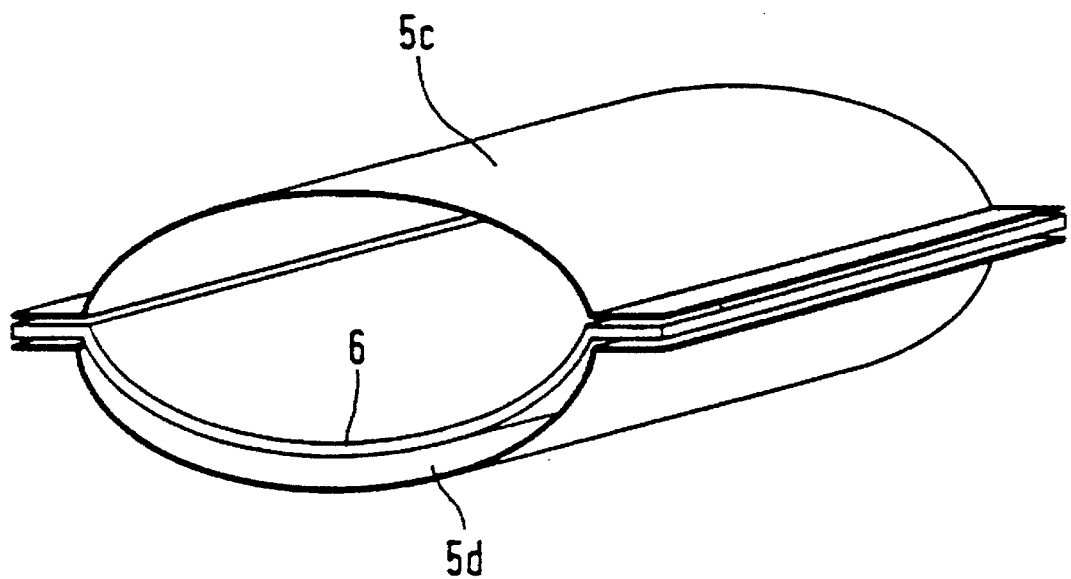
FIG. 17 shows a gradient coil arrangement constructed in accordance with the principles of the present invention with the lower part is built into a patient support.

The gradient coil arrangement need not necessarily have a circular cross section. On the contrary, it can be adapted better to the shape of the human body and—as shown in FIG. 16—can, for example, have an elliptical cross section.

The lower part of the hollow cylinder 5 can also be built into a patient bed 6 that can be pushed into the examination space. The upper part 5c of the gradient coil arrangement then simply has to be placed onto the patient bed 6. It has proven especially advantageous in this embodiment that no disturbing contacts are present.

Figure 18:
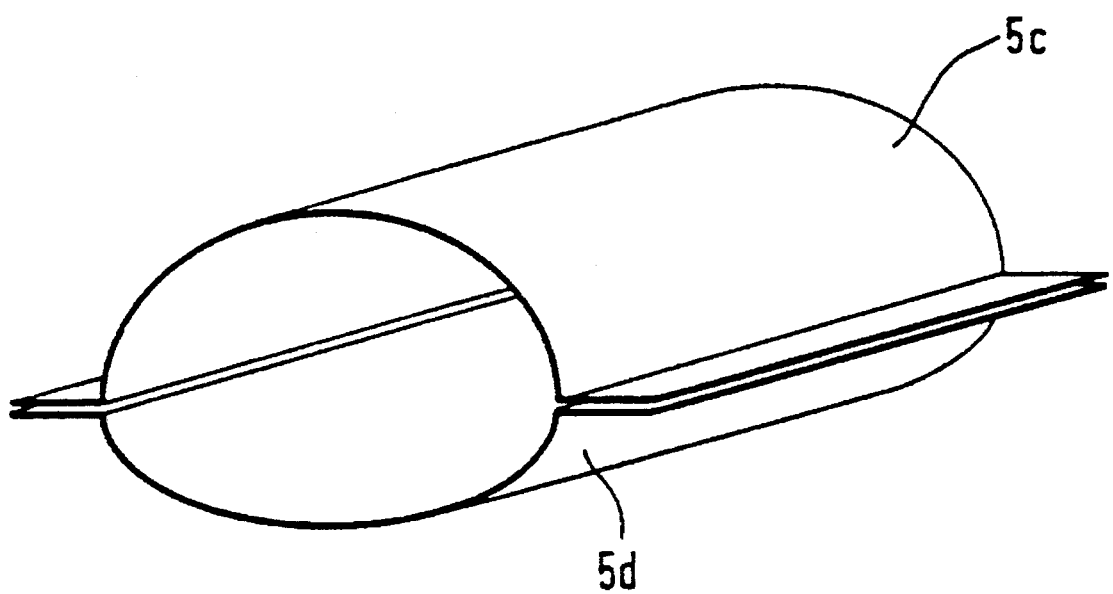
FIG. 18 shows a gradient coil arrangement constructed in accordance with the principles of the present invention wherein the upper part and lower part are asymmetrical relative to one another.

The upper and lower parts need not be symmetrical relative to one another. As shown in FIG. 18, for example, the upper part 5c can be clearly larger than the lower part 5d.

Gradient coils usually have the problem of the presence of eddy currents that disturb the magnetic field being generated in the cryoshields of magnets by the gradient field. Actively shielded gradient coils are therefore often utilized, i.e. a shielding coil that is dimensioned such that the magnetic field generated by the gradient coil is highly attenuated toward the cryoshield is additionally arranged around the actual gradient coil. Local gradient coils are at a greater distance from the cryoshield of the magnet, so that they generate noticeably lower eddy current components. One is therefore more likely to be able to manage without active shielding than given a conventional gradient coil. As needed, of course, additional shielding coils can be employed.

For calculating optimized winding curves (paths) for the gradient coil conductor, the method disclosed in U.S. Pat. No. 5,309,107. As set forth below, the method merely has to be somewhat modified. One proceeds according to the following steps.

Figure 19:
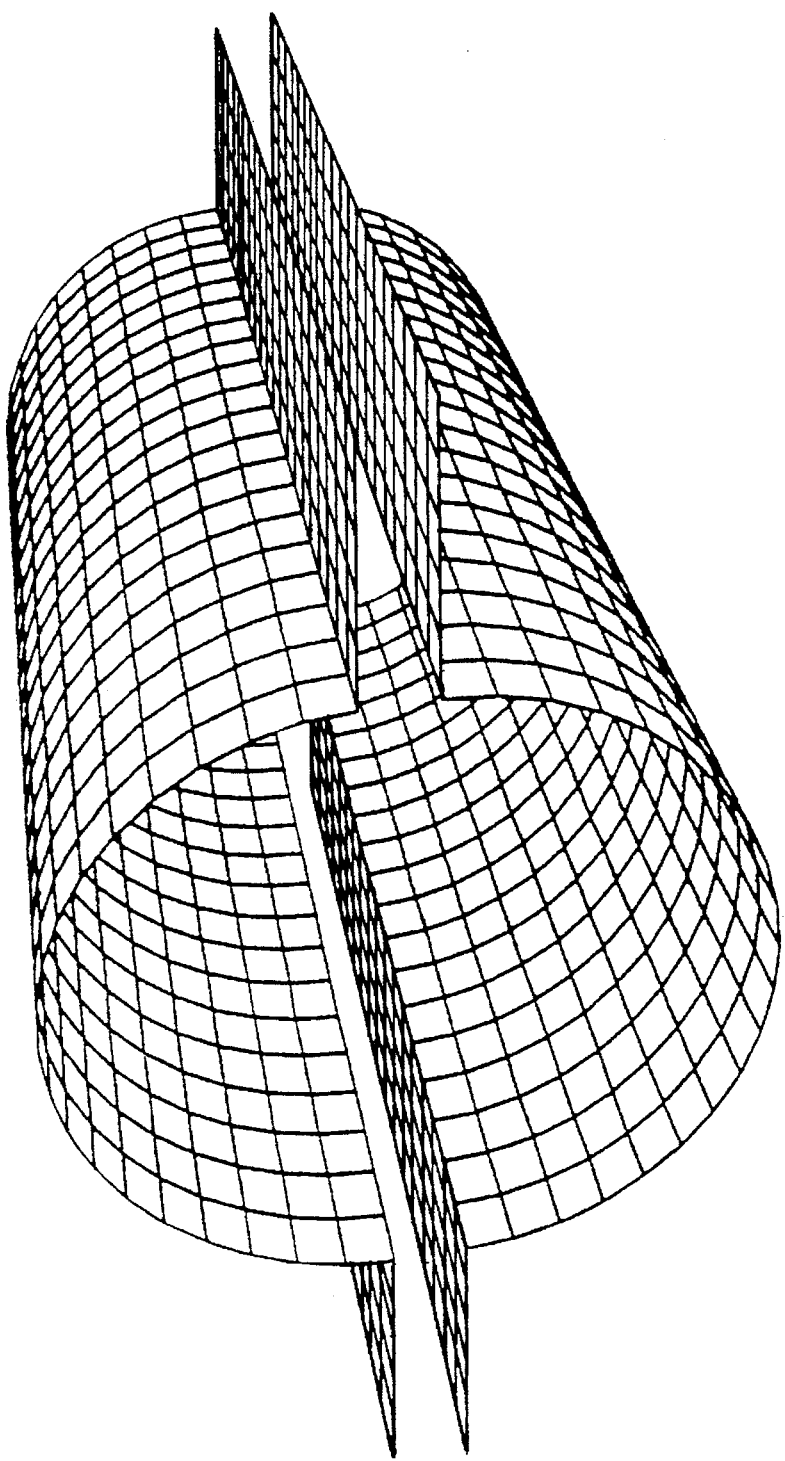
FIG. 19 illustrates a grid mesh network for calculating the conductor winding path for the gradient coils for the above arrangements.

First, a mesh network (for calculation purposes) is superimposed on the generated surface of the selected coil version. FIG. 19 shows an example of an arrangement having radially projecting surfaces. The m meshes obtained in this way are consecutively numbered (1,2, ... m) for the purpose of a mathematical ordering.

Second, a plurality of n points (spatial points) $P_i$ (i=1, ... n), with n>m, are selected in the volume of interest. The desired target field $Z_i$ is defined by these spatial points.

Figure 20:
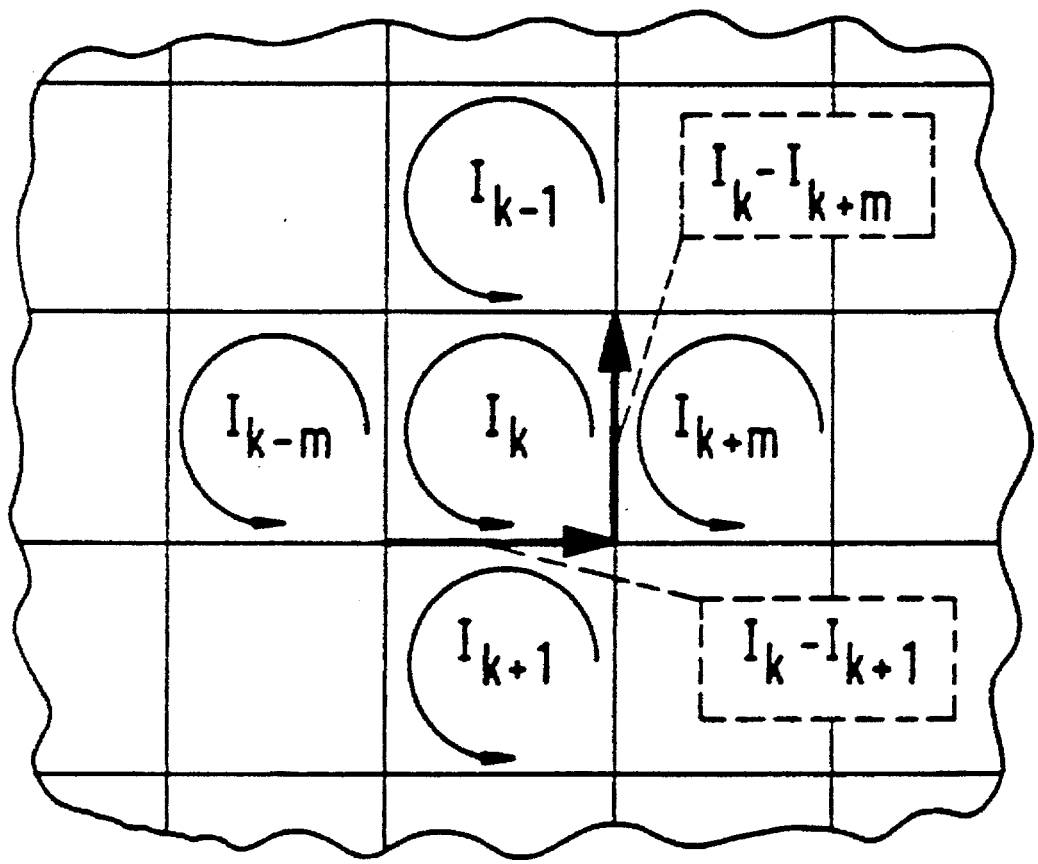
FIG. 20 illustrates the division of the gradient coil into individual elementary coils for implementing calculation of the winding path for the coil conductor in the above arrangements.

Third, it is assumed that a unit current successively flows in each of the m meshes. This is shown in FIG. 20. The field $b_{ij}$ generated by this unit current is thereby calculated for each of the n points for each mesh. The valve $b_{ij}$ is thus the field contribution of a unit current in the $j^{th}$ mesh at the location of the $i^{th}$ point. Let $\underline{\underline{b}}=(b_{ij})$ be the effective matrix of all mesh elements; further, let $\underline{l}^t=(l_1, l_2, \ldots l_m)$ be a vector with mesh currents, i.e. let $l_k$ be the current that flows in the $k^{th}$ mesh. Further, let $\underline{B}^t=(B_1, B_2, \ldots B_n)$, with $B_k=\Sigma b_{kj} \cdot l_j$, be the vector of all field contributions in the n points. Then $$\underline{B}=\underline{\underline{b}} \cdot \underline{l}$$

Fourth, a solution vector $\underline{l}$ is defined by a suitable FIT algorithm (for example, least mean square FIT) such that the sum of the quadratic deviations from the target field becomes minimum. This occurs, for example, by multiplication of the above relationship by the term $(\underline{\underline{b}}^t \cdot \underline{\underline{b}})^{-1} \cdot \underline{\underline{b}}^t$. One obtains $$\underline{l}=(\underline{\underline{b}}^t \cdot \underline{\underline{b}})^{-1} \cdot \underline{\underline{b}}^t \cdot \underline{B}$$

Fifth, since every mesh branch (except the edge meshes) belongs to respectively two neighboring meshes, the resultant current for each such branch must be determined by superimposition of the two mesh currents (see FIG. 20). The interruption edge of the two coil parts is thereby composed of edge meshes via which no current path leads. A global current distribution thus arises on the generated surface which generates the desired target field and which also satisfies the continuity equation (the latter applies since each mesh is self-contained). Adherence to this condition is important since a simulation of the spatial distribution of current through a closed circuit is possible only in this way. It is assured by observing the continuity equation that each sub-coil will ultimately constitute a closed winding curve that cannot cross the separating line because of the mesh definitions.

Sixth, the given current distribution is simulated with discrete conductors that are traversed by a constant reference (predetermined) current. Various possible solutions are known. For example, a defined area wherein the calculated current should flow can first be assigned to each mesh branch (mesh width·mesh length). The global current distribution in the generated surface thereby becomes a surface current density distribution and, after a further division by the reference current, a turns density distribution in the given generated surface. The spatial curve of the respective conductor can be determined therefrom by integration along suitable integration paths (for example, projection of a straight line through the stagnation point of the turns density distribution onto the generated surface). To this end, the turns density functions is integrated along the path until the integral value becomes a whole number. The position of the conductor is determined within the integral limits calculated in this way such that winding parts of identical size come to lie at both sides.

In the invention set forth herein, the emphasis of the optimization task that is undertaken could, for example, be the minimization of the dissipative losses. This additional demand, however, runs somewhat contrary to the required field curve in the useful volume. In the simplest case, this additional demand can, of course, be quite simply met in that no current at all flows; of course, a useful field would also not be present. Such competing objectives are generally set in relationship to one another in an optimization task by means of weighting factors. For example, the function to be minimized could be defined in the following way:

Each side of a mesh (referred to as branch) can have a relative resistance $R_i$ (i=1, . . . ,v) allocated to it that is proportional to the length $L_i$ of the branch and inversely proportional to the width $B_i$ thereof: $R_i=L_i/B_i$. The dissipative contribution of this mesh branch to the overall thermal load is therefore proportional to $R_i J_i^2$, whereby $J_i=I_k-I_m$ stands for the current that flows across the $i^{th}$ branch that is shared by the $k^{th}$ mesh and the $m^{th}$ mesh.

The above-described weighting factor is referenced w. The optimization task then constitutes:

$$\text{minimize} \quad Q = \sum_{i=1}^{v} \left[ \left( \sum_{j=1}^{m} b_{ij} \cdot I_j \right) - Z_i \right]^2 + w \cdot \sum_{i=1}^{v} R_i \cdot J_i^2$$

Additionally, the boundary condition of optimally low dissipative losses can be combined with other physical demands such as, for example, minimization of the coil energy. All self-inductances and coupling inductances of the mesh network are calculated for this purpose. If the coupling inductance of the $k^{th}$ mesh with the $l^{th}$ is referenced $L_{kl}$ and the self-inductance of the $k^{th}$ mesh is $L_{kk}$, the coil energy is then calculated as:

$$w = 1/2 \cdot \sum_{k} L_{kk} I_k^2 + \sum_{K<l} L_{kl} I_k I_l$$

Finally, the function $Q_w$ to be minimized is correspondingly expanded:

$$Q_w = Q + \omega \cdot W.$$

($\omega$ is a further weighting factor that places the minimization of the coil energy in relationship to the aforementioned demands.)

Although modifications and changes may be suggested by those skilled in the art, it is the intention of the inventors to embody within the patent warranted hereon all changes and modifications as reasonably and properly come within the scope of their contribution to the art.

We claim as our invention:

1. A local gradient coil arrangement for use in a nuclear magnetic resonance tomography apparatus, comprising:

a plurality of gradient coils, each having a conductor, disposed to form a hollow-cylindrical geometrical combination;

said geometrical combination having at least one separating line permitting said geometrical combination to be separated at at least one side thereof along an axial direction;

each gradient coil conductor crossing said separating line being interrupted at said separating line; and each gradient coil having current-carrying connecting lines proceeding parallel to and on opposite sides of said separating line.

2. A local gradient coil arrangement as claimed in claim 1 wherein said geometrical combination has an axially extending hinge disposed on a side of said geometrical combination opposite said separating line, said hinge and said separating line dividing said geometrical combination into an upper part and a lower part, and said hinge permitting said upper part to be swung away from said lower part.

3. A local gradient coil arrangement as claimed in claim 1 comprising two said separating lines disposed on opposite sides of said geometrical combination and dividing said geometrical combination into an upper part and a lower part and permitting said upper part to be completely removed from said lower part.

4. A local gradient coil arrangement as claimed in claim 1 wherein said separating line divides said geometrical combination into an upper part and a lower part, and wherein said upper and lower parts azimuthally overlap at said separating line.

5. A local gradient coil arrangement as claimed in claim 1 wherein said separating line divides said geometrical combination into an upper part and a lower part, and wherein each of said upper and lower parts comprises radially extending and overlapping projections at said separating line, said connecting lines being disposed in said projections.

6. A local gradient coil arrangement as claimed in claim 1 wherein said separating line divides said geometrical combination into an upper part and a lower part, and wherein said upper and lower parts overlap at said separating line and wherein each of said upper parts has a comb-like edge at said separating line, said comb-like edges of said upper and lower parts engaging into each other at said separating line.

7. A local gradient coil arrangement as claimed in claim 1 comprising two of said separating lines disposed on opposite sides of said geometrical combination and dividing said geometrical combination into an upper part and a lower part, said separating lines comprising guide rails along which said upper and lower parts are relatively axially movable and said gradient coil arrangement being separable by displacing one of said upper and lower coil parts axially relative to the other of said upper and lower coil parts.

8. A local gradient coil arrangement as claimed in claim 1 wherein said separating line divides said geometrical combination into an upper part and a lower part, and said local coil arrangement further comprising a patient bed with said lower coil part being integrated into said patient bed.

9. A local gradient coil arrangement as claimed in claim 1 wherein said separating line divides said geometrical combination into an upper part and a lower part, said upper and lower parts being asymmetrical relative to each other.

10. A local gradient coil arrangement as claimed in claim 1 wherein said geometrical combination has a substantially elliptical cross-section.

* * * * *